(12) United States Patent
Kim et al.

(10) Patent No.: US 11,326,247 B2
(45) Date of Patent: May 10, 2022

(54) TRANSPARENT NANOLAYERED STRUCTURE HAVING IMPROVED WEAR-RESISTANT AND FLEXIBILITY

(71) Applicant: INDUSTRY-ACADEMIC COOPERATION FOUNDATION, YONSEI UNIVERSITY, Seoul (KR)

(72) Inventors: Dae-Eun Kim, Seoul (KR); Oleksiy Penkov, Gyeonggi-do (KR); Kuk Jin Seo, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 3 days.

(21) Appl. No.: 16/775,563

(22) Filed: Jan. 29, 2020

(65) Prior Publication Data

US 2020/0239999 A1 Jul. 30, 2020

(30) Foreign Application Priority Data

Jan. 30, 2019 (KR) .................. 10-2019-0011876

(51) Int. Cl.
*C23C 14/06* (2006.01)
*C23C 14/35* (2006.01)
(Continued)

(52) U.S. Cl.
CPC ...... *C23C 14/0647* (2013.01); *C03C 17/3435* (2013.01); *C23C 14/0057* (2013.01); *C23C 14/0652* (2013.01); *C23C 14/35* (2013.01); *C03C 2217/78* (2013.01); *C03C 2218/155* (2013.01); *C03C 2218/156* (2013.01)

(58) Field of Classification Search
CPC ............. G02B 1/14; C23C 16/34–347; C23C 14/0641–0658; C23C 14/0664; C03C 17/3435
See application file for complete search history.

(56) References Cited

U.S. PATENT DOCUMENTS 4,772,304 A * 9/1988 Nakae ..................... C23C 16/34
  65/17.4
5,204,295 A * 4/1993 Paine, Jr. .............. C03C 17/225
  501/96.2

(Continued)

FOREIGN PATENT DOCUMENTS

KR 100448714 9/2004
KR 20110007377 1/2011
(Continued)

OTHER PUBLICATIONS

Kim et al., "Hard, Flexible, and Transparent Nanolayered SiNx/BN Periodical Coatings", ACS Applied Materials & Interfaces, 2019 (Year: 2019).*

(Continued)

*Primary Examiner* — Z. Jim Yang
(74) *Attorney, Agent, or Firm* — Hauptman Ham, LLP

(57) ABSTRACT

Provided is a transparent structure having improved wear resistance and flexibility, and a structure according to the present invention is a nanolayered structure in which a nitride nanofilm of one or more elements selected from metals and metalloids; and a boron nitride nanofilm are alternately layered.

15 Claims, 7 Drawing Sheets

(51) Int. Cl.
*C03C 17/34* (2006.01)
*C23C 14/00* (2006.01)

(56) References Cited

U.S. PATENT DOCUMENTS

| | | | | |
|---|---|---|---|---|
| 5,670,252 | A * | 9/1997 | Makowiecki | C23C 14/18 428/688 |
| 5,700,551 | A * | 12/1997 | Kukino | C23C 30/005 427/419.7 |
| 6,593,015 | B1 * | 7/2003 | Inspektor | C23C 30/005 428/472 |
| 2003/0165693 | A1 * | 9/2003 | Hartig | C03C 17/36 428/432 |
| 2003/0201540 | A1 * | 10/2003 | Ahn | C23C 16/45529 257/E21.292 |
| 2004/0247949 | A1 * | 12/2004 | Akedo | H01L 51/5256 428/917 |
| 2005/0224897 | A1 * | 10/2005 | Chen | H01L 29/517 257/900 |
| 2009/0022969 | A1 * | 1/2009 | Zhang | C23C 30/005 428/216 |
| 2013/0239893 | A1 * | 9/2013 | Suzuki | H01L 21/0228 118/724 |
| 2014/0057099 | A1 * | 2/2014 | Koshy | H01L 21/0332 977/890 |
| 2014/0272391 | A1 * | 9/2014 | Kumar | C23C 28/42 428/457 |
| 2014/0362444 | A1 * | 12/2014 | Paulson | C09D 5/006 359/586 |
| 2016/0366777 | A1 * | 12/2016 | Rogers | C03C 17/3411 |
| 2018/0029929 | A1 * | 2/2018 | Paulson | H05K 5/03 |
| 2018/0076032 | A1 * | 3/2018 | Wang | H01L 27/11582 |
| 2018/0237336 | A1 * | 8/2018 | Boyce | C23C 14/086 |
| 2019/0292649 | A1 * | 9/2019 | Utsumi | C23C 14/3485 |
| 2020/0019750 | A1 * | 1/2020 | Troccoli | C23C 28/42 |
| 2020/0262703 | A1 * | 8/2020 | Guan | C03C 25/16 |
| 2021/0063609 | A1 * | 3/2021 | Bellman | C03C 17/3435 |
| 2021/0130230 | A1 * | 5/2021 | Decker | G02B 1/118 |

FOREIGN PATENT DOCUMENTS

| | | | | |
|---|---|---|---|---|
| KR | 20140146203 | | 12/2014 | |
| KR | 20170009231 | | 1/2017 | |
| KR | 101733145 | | 5/2017 | |
| KR | 20170076694 | | 7/2017 | |
| KR | 20170138444 | | 12/2017 | |
| WO | WO-2016138195 | A1 * | 9/2016 | C03C 17/3452 |
| WO | WO-2019046762 | A1 * | 3/2019 | G02B 1/14 |

OTHER PUBLICATIONS

Office Action dated Oct. 25, 2020 for corresponding case No. KR 10-2019-0011876. (pp. 1-4).

Xu et al., Jingjing, "The Design and Synthesis of Hard and Impermeable, Yet Flexible, Conformal Organic Coatings," Advanced Materials, 2012, pp. 1-5.

J. Musil, "Flexible hard nanocomposite coatings," RSC Advances, Jul. 7, 2015, pp. 60482-60495. DOI: 10.1039/c5ra09586g (pp. 1-14).

Office Action dated Feb. 18, 2021 for corresponding application No. KR 10-2019-0011876 (pp. 1-5).

* cited by examiner

TRANSPARENT NANOLAYERED STRUCTURE HAVING IMPROVED WEAR-RESISTANT AND FLEXIBILITY

CROSS-REFERENCE TO RELATED APPLICATIONS

This application claims priority under 35 U.S.C. § 119 to Korean Patent Application No. KR10-2019-0011876, filed on Jan. 30, 2019, in the Korean Intellectual Property Office, the disclosure of which is incorporated herein by reference in its entirety.

TECHNICAL FIELD

The following disclosure relates to a transparent nanolayered structure which may have excellent wear resistance and flexibility to be used as a flexible hard coating and a device including the same.

BACKGROUND

Wear resistance improvement is a core technology in various application fields such as a microelectromechanical system and an artificial joints, as well as macroscopic mechanical or automotive industries. As the efficiency and life of a system, including a sliding part, are significantly reduced by wear, technology to improve wear resistance is being continuously developed for saving resources and energy.

For reduction of friction and wear in various applications, hard and soft metal coating, super hard diamond-like coating such as diamond-like carbon (DLC), chemical coating such as alkanethiol self-assembled monomolecular film, micro- or nano-composite coating technology, and the like have been developed.

However, as a wearable electronic device or flexible electronic device has been extensively developed, a protective film in which various mechanical/optical characteristics such as flexibility, elasticity, and transparency, as well as wear resistance are combined, is required.

Recently, flexible and scratch resistant organic coatings (Xu, J., Asatekin, A. & Gleason, K. K. The design and synthesis of hard and impermeable, yet flexible, conformal organic coatings. Adv. Mater. 24, 3692-3696 (2012)) were developed. But such coatings demonstrated a hardness less than 1 GPa which was 5 to 10 times lower than that of common soda-lime glass, and 20 to 30 times lower than that of a common inorganic material-based wear-resistant coating layer.

As described above, an organic material-based coating may have high flexibility but has a limit to hardness and scratch resistance improvement, and an inorganic material-based coating has a high hardness and good wear resistance, but is hardly elastic and has high brittleness, thereby having a limit to flexibility and elasticity improvement.

Thus, the development of a coating technology having high hardness while satisfying both flexibility and optical transparency is required.

RELATED ART DOCUMENTS

Non-Patent Documents

Adv. Mater. 24, 3692-3696 (2012)

SUMMARY

An embodiment of the present invention is directed to providing a nanolayered structure having high flexibility and transparency while having excellent mechanical and physical properties.

Another embodiment of the present invention is directed to providing a nanolayered structure that satisfies the requirements of a flexible hard coating and may be used as a flexible hard coating.

Still another embodiment of the present invention is directed to providing a nanolayered structure which may be produced by a room-temperature process, has no substantial restriction on the material of an article (object to be protected) of which the surface is to be protected, and may produce an article free from thermal damage.

In one general aspect, a nanolayered structure includes a structure in which a nitride nanofilm of one or more elements selected from metals and metalloids; and a boron nitride nanofilm are alternately layered.

In the nanolayered structure, according to an exemplary embodiment of the present invention, the nitride nanofilm and the boron nitride nanofilm may independently of each other have a thickness from a sub-nanometer order to a nanometer order.

In the nanolayered structure, according to an exemplary embodiment of the present invention, in at least a surface portion of the nanolayered structure, a layered area in which the nitride nanofilm and the boron nitride nanofilm having a sub-nanometer thickness are alternately layered may be positioned.

In the nanolayered structure, according to an exemplary embodiment of the present invention, the thickness of the nitride nanofilm or the boron nitride nanofilm, or the thicknesses of the nitride nanofilm and the boron nitride nanofilm may be varied in a layering direction of the nanolayered structure.

In the nanolayered structure, according to an exemplary embodiment of the present invention, the thickness of the boron nitride nanofilm may be continuously or discontinuously decreased or increased in a layering direction of the nanolayered structure.

The nanolayered structure according to an exemplary embodiment of the present invention includes a layered area in which the nitride nanofilm and the boron nitride nanofilm are alternately layered, and the layered area may include a first layered area, a second layered area, and a third layered area, in which the thickness of the boron nitride nanofilm is decreased depending on the layering direction for each layered area.

In the nanolayered structure, according to an exemplary embodiment of the present invention, the nitride of the nitride nanofilm may be in the state of nitrogen deficiency (N-deficiency).

In the nanolayered structure, according to an exemplary embodiment of the present invention, each of the nitride nanofilm and the boron nitride nanofilm may be an amorphous film.

In the nanolayered structure, according to an exemplary embodiment of the present invention, the boron nitride of the boron nitride nanofilm may have an sp3 bond.

In the nanolayered structure, according to an exemplary embodiment of the present invention, the nitride nanofilm and the boron nitride nanofilm may independently of each other have a thickness of 0.2 nm to 5.0 nm.

In the nanolayered structure according to an exemplary embodiment of the present invention, a thickness ratio obtained by dividing the thickness of the boron nitride nanofilm by the thickness of the nitride nanofilm in which the boron nitride nanofilm and the nitride nanofilm are in contact with each other, maybe 0.2 to 1.2.

In the nanolayered structure, according to an exemplary embodiment of the present invention, the nitride and the boron nitride may be intermixed with each other in an interface between the nitride nanofilm and the boron nitride nanofilm.

In the nanolayered structure, according to an exemplary embodiment of the present invention, the nitride of the nitride nanofilm may be titanium nitrides, tungsten nitrides, silicon nitrides, tantalum nitrides, aluminum nitrides, chromium nitrides, or composite nitrides thereof.

In the nanolayered structure, according to an exemplary embodiment of the present invention, the structure may have a thickness of 100 to 1000 nm.

In the nanolayered structure according to an exemplary embodiment of the present invention, the nanolayered structure may include one or more dopants of a first dopant which provides a forbidden band between energy band gaps of the nitride with an energy level and a second dopant which provides a forbidden band between energy band gaps of the boron nitride with an energy level.

In another general aspect, an article includes the nanolayered structure positioned in at least a portion of a surface.

In an exemplary embodiment of the present invention, the article may include an optical device, a wearable device, a flexible device, an optoelectronic device, a photovoltaic device, or a micro-electromechanical system (MEMS).

Other features and aspects will be apparent from the following detailed description, the drawings, and the claims.

DETAILED DESCRIPTION OF EMBODIMENTS

Figure 1:
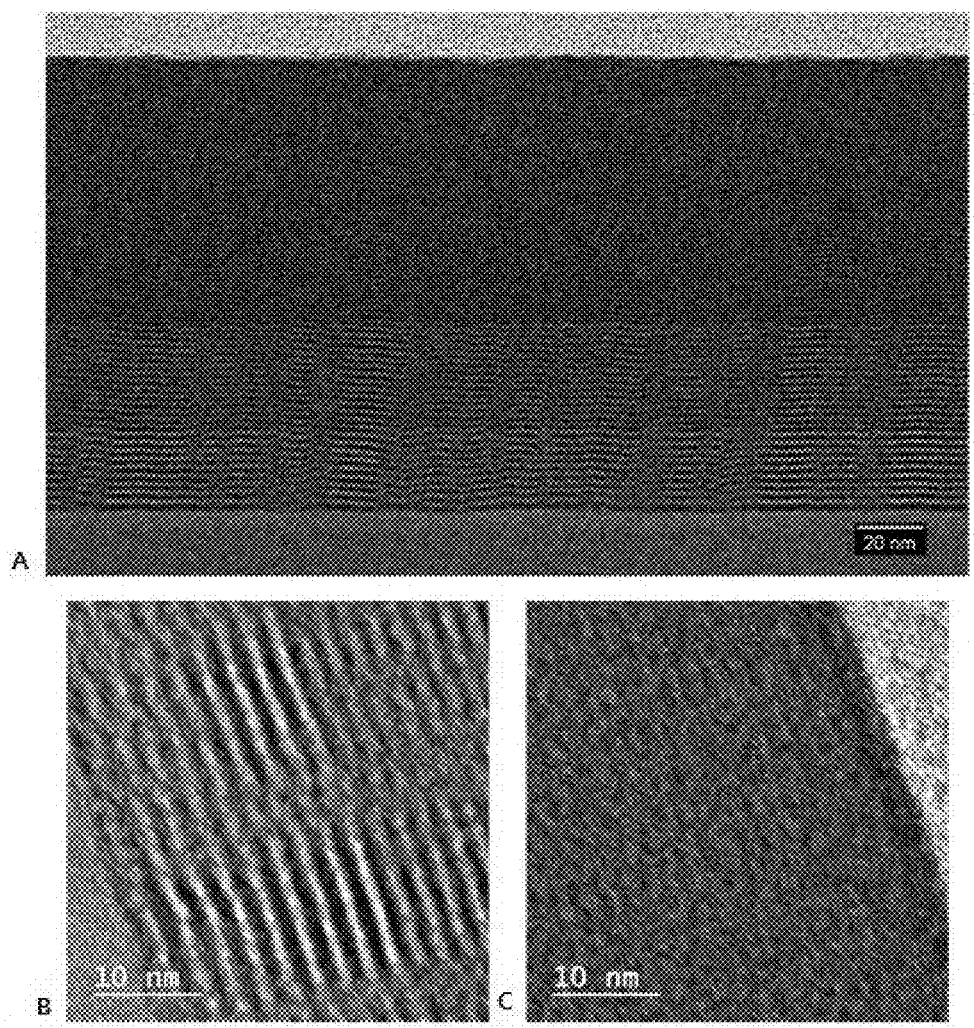
FIG. 1 illustrates a transmission electron microscope image and high-resolution transmission electron microscope (HR-TEM) images of a nanolayered structure produced in Example 1.

The advantages, features, and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, referring to accompanying drawings, a nanolayered structure according to the present invention and a device including the same will be described in detail. The drawings are provided below for an example so that the idea of the present invention can be sufficiently transferred to a person skilled in the art to which the present invention pertains. Therefore, the present invention is not limited to the drawings provided below but may be embodied in many different forms, and the drawings suggested below may be exaggerated in order to clear the spirit of the present invention. Technical terms and scientific terms used herein have the general meaning understood by those skilled in the art to which the present invention pertains unless otherwise defined, and a description for the known function and configuration which may unnecessarily obscure the gist of the present invention will be omitted in the following description and the accompanying drawings.

The present applicant conducted an extensive study for a long time in order to develop a transparent flexible hard coating structure, and as a result, found that a layered structure in which nitride nanofilms which are different from each other are alternately layered is formed, but when a hard nitride nanofilm, in particular, a hard nitride nanofilm in the state of N-deficiency and a boron nitride nanofilm are alternately layered, a high hardness, excellent flexibility, and visible transparency which are difficult to satisfy simultaneously maybe all satisfied, and conducted a more extensive study thereon to complete the present invention.

In the description of the present invention, unless a thickness is not particularly defined, a nanofilm refers to a film having a thickness from a nanometer order to a sub-nanometer order.

The thickness from a nanometer order to a sub-nanometer order may refer to a thickness from several nanometers to several angstroms, and the nanofilm may refer to, as a specific example, a film having a thickness of 9 nm to 0.1 nm, and as an exemplary embodiment, a film having a thickness of 0.2 to 1.5 nm.

In the present invention, a thickness of a sub-nanometer order refers to a thickness of less than 1 nm, that is, a thickness of an angstrom (Å) order. Specifically, a thickness of a sub-nanometer order, a thickness of an angstrom order, or a sub-nanometer thickness may refer to a thickness of 1 to 9 Å (0.1 to 0.9 nm), specifically a thickness of 0.2 to 0.9 nm, and more specifically a thickness of 0.2 to 0.7 nm.

In the present invention, a thickness of a non-sub-nanometer order refers to a thickness of nanometer order. Specifically, a thickness of a non-sub-nanometer order may refer to a thickness of 1 to 9 nm, specifically a thickness of 1.0 to 1.5 nm.

In the present invention, unless particularly defined, a nitride of a nitride film may refer to a nitride of one or more elements selected from metals and metalloids.

The nanolayered structure, according to the present invention includes a laminate (coating) in which a nitride nanofilm of one or more elements selected from metals and metalloids; and a boron nitride nanofilm are sequentially alternately layered. As a specific example, the nanolayered structure may be layered in an order of nitride nanofilm-boron nitride nanofilm-nitride nanofilm-boron nitride nanofilm, or in an order of boron nitride nanofilm-nitride nanofilm-boron nitride nanofilm-nitride nanofilm, and as an exemplary embodiment, the nanolayered structure may be layered in an order of nitride nanofilm-boron nitride nanofilm-nitride nanofilm-boron nitride nanofilm.

The nanolayered structure according to the present invention has a structure in which the nitride nanofilm and the boron nitride nanofilm are sequentially alternately layered, thereby having physical properties which are different from the physical properties shown in a nitride thick film and a boron nitride thick film of an order of several tens of nanometers to several micrometers and a laminate of these thick films, and having surprisingly improved physical properties (mechanical and optical physical properties such as strength, Young's modulus, elastic recovery rate, and transparency).

Specifically, the nanolayered structure according to the present invention has a structure in which the nitride nanofilm and the boron nitride nanofilm are sequentially alternately layered, thereby satisfying properties which are difficult to satisfy all simultaneously, that is, a high hardness that is close to that of an inorganic material used in a wear-resistant coating, excellent flexibility that is close to that of an organic material used in a wear-resistant coating, and a physical property of visible transparency that is close to that of a transparent electrode.

The nitride nanofilm and the boron nitride nanofilm may independently of each other have a thickness of 0.2 to 5.0 nm, specifically 0.2 to 1.5 nm, so that each nanofilm which is alternately layered may stably maintain a film form of a dense continuum of a material (nitride or boron nitride) and have more improved mechanical/optical physical properties. More specifically, the nitride nanofilm may have a thickness of 0.2 to 5.0 nm, specifically 0.2 to 1.5 nm, and more specifically 0.5 to 1.5 nm, and the boron nitride nanofilm may have a thickness of 0.2 to 5.0 nm, specifically 0.2 to 1.5 nm, more specifically 0.2 to 1.3 nm, and still more specifically 0.3 to 1.1 nm.

In an advantageous example, the nanolayered structure may include the boron nitride nanofilm having a sub-nanometer thickness (0.1 to 0.9 nm), specifically a thickness of 0.2 to 0.9 nm, and more specifically, a thickness of 0.3 to 0.7 nm. When the boron nitride nanofilm has the sub-nanometer thickness described above, the mechanical strength of the nanolayered structure may be surprisingly improved, and both mechanical strength and flexibility may be improved.

Specifically, when the boron nitride nanofilm has a sub-nanometer thickness, hardness improvement of 140% or more and hardness/Young's modulus improvement of 110% or more may be achieved relative to a structure in which the nitride film having the same thickness and a boron nitride nanofilm having a non-sub-micrometer thickness (1 to 9 nm), specifically a thickness of 1.0 to 1.5 nm are alternately layered.

As a specific example, the nanolayered structure may include a laminate in which the nitride nanofilm and the boron nitride nanofilm having a sub-nanometer thickness are alternately layered. As another example, the nanolayered structure may include a laminate in which the nitride nanofilm having a sub-nanometer thickness and the boron nitride nanofilm having a sub-nanometer thickness are alternately layered. As another example, the nanolayered structure may include a laminate in which the nitride nanofilm having a non-sub-nanometer (nanometer order) thickness and the boron nitride nanofilm having a sub-nanometer thickness are alternately layered.

Here, the expression "the nanolayered structure includes the boron nitride nanofilm having a sub-nanometer thickness" should not be limitedly interpreted as being that the thickness of all boron nitride nanofilm forming the nanolayered structure is a sub-nanometer thickness.

The expression "the nanolayered structure includes the boron nitride nanofilm having a sub-nanometer thickness" includes the case in which the boron nitride nanofilm having a sub-nanometer thickness is positioned in at least a portion of the nanolayered structure and the case in which the thickness of at least one of the boron nitride nanofilms which are alternately layered with the nitride nanofilms is a sub-nanometer thickness.

As described above, when the boron nitride nanofilm has a sub-nanometer thickness, the laminate may have surprisingly improved hardness, and this property is very advantageous for wear resistance improvement. Thus, it is advantageous that the boron nitride nanofilm having a sub-nanometer thickness is positioned in at least a surface portion of the nanolayered structure. Here, the surface portion of the nanolayered structure may refer to an area from the surface to a depth of 0.1 $T_{total}$ to 0.5 $T_{total}$ of the nanolayered structure, when the total thickness of the laminate is $T_{total}$.

The nanolayered structure, according to the present invention, is based on a structure in which the nitride nanofilm and the boron nitride nanofilm are alternately layered. Accordingly, the nitride nanofilm having a constant thickness and the boron nitride nanofilm having a constant thickness are alternately layered in a layering direction of the nanolayered structure, whereby the nanolayered structure may have uniform physical properties.

In contrast, the nitride nanofilm, the boron nitride nanofilm, or the nitride nanofilm and the boron nitride nanofilm may have changed thicknesses in a layering direction of the nanolayered structure, and due to the changed thickness, the nanolayered structure may have changed mechanical properties such as strength, ductility, or elasticity overall depending on the layering direction. Here, the layering direction may refer to a direction from a side in contact with an article to be protected using the nanolayered structure to a surface side, in the nanolayered structure.

That is, the thickness of the nitride nanofilm or the boron nitride nanofilm may be the same in the layering direction of the nanolayered structure, or the thickness of the nitride nanofilm or the boron nitride nanofilm may be continuously or discontinuously varied in the layering direction. As an example, the thickness of the nitride nanofilm or the boron nitride nanofilm may be continuously or discontinuously increased or decreased in the layering direction.

As described above, the thicknesses of the nitride nanofilm, the boron nitride nanofilm, or the nitride nanofilm and the boron nitride nanofilm may be changed in the layering direction of the nanolayered structure, and accordingly, the nanolayered structure may have different mechanical/optical physical properties depending on the layering direction (thickness direction).

As a specific example, the nanolayered structure may satisfy any one of the following I) to VIII):

I) a nitride nanofilm having a constant thickness and a boron nitride nanofilm having a constant thickness, II) a nitride nanofilm having a constant thickness and a boron nitride nanofilm having a continuously or discontinuously increased thickness in a layering direction, III) a nitride nanofilm having a constant thickness and a boron nitride nanofilm having a continuously or discontinuously decreased thickness in the layering direction, IV) a nitride nanofilm having a continuously or discontinuously increased thickness in the layering direction and a boron nitride nanofilm having a constant thickness, V) a nitride nanofilm having a continuously or discontinuously decreased thickness in the layering direction and a boron nitride nanofilm having a constant thickness, VI) a nitride nanofilm having a continuously or discontinuously increased thickness in the layering direction and a boron nitride nanofilm having a continuously or discontinuously increased thickness in the layering direction, VII) a nitride nanofilm having a continuously or discontinuously decreased thickness in the layering direction and a boron nitride nanofilm having a continuously or discontinuously decreased thickness in the layering direction, VIII) a nitride nanofilm having a continuously or discontinuously increased thickness in the layering direction and a boron nitride nanofilm having a continuously or discontinuously decreased thickness in the layering direction, and IX) a nitride nanofilm having a continuously or discontinuously decreased thickness in the layering direction and a boron nitride nanofilm having a continuously or discontinuously increased thickness in the layering direction.

Here, the expression "a film having a continuously changed (increased or decreased) thickness in the layering direction" means that the thicknesses of two nanofilms (as an example, two boron nitride nanofilms) of one material which adjoin each other, with a nanofilm of another material (as an example, a nitride nanofilm) interposed therebetween, are increased or decreased, and the increase or decrease is made over a portion of the nanolayered structure, as a specific example, over 0.1 $T_{total}$ to the entire thickness, based on $T_{total}$.

In addition, the expression "a film having a discontinuously changed (increased or decreased) thickness in the layering direction" may mean in the case in which the nanolayered structure includes nanofilms of one material (nanofilms of nitride or boron nitride) having a different thickness from each other when one nitride nanofilm and one boron nitride nanofilm which are in contact with each other and alternately layered are a unit film, the thicknesses of the nitride nanofilm and the boron nitride nanofilm are the same (no change in the thickness) in at least two unit films adjoining each other.

As a specific example, the expression "a film having a discontinuously changed (increased or decreased) thickness in the layering direction" may mean the case in which a nitride nanofilm having a 1-1 thickness and a boron nitride nanofilm having a 2-1 thickness are alternately layered M times (M is a natural number or 2 or more) in the layering direction, and a nitride nanofilm having a 1-2 thickness and a boron nitride nanofilm having a 2-2 thickness are alternately layered N times (N is independent of M, a natural number of 2 or more), and the 1-1 thickness and the 1-2 thickness and/or the 2-1 thickness and the 2-2 thickness are different from each other. Here, an area in which the nitride nanofilm (as an example, the 1-1 thickness) and the boron nitride nanofilm (as an example, the 2-1 thickness) having the same thickness are layered may have a thickness of 0.1 $T_{total}$ to 0.9 $T_{total}$, as a specific example, 0.1 $T_{total}$ to 0.8 $T_{total}$, based on $T_{total}$, but the thickness is not necessarily limited thereto.

In addition, in the case of VIII) or IX) when one nitride nanofilm and a boron nitride nanofilm which is positioned to adjoin a lower portion of the one nitride nanofilm (in the side of an article to be protected) are one unit, the nanolayered structure may satisfy any one of the following VIII') to IX'):

VIII') a nitride nanofilm having a continuously or discontinuously increased thickness in the layering direction and a boron nitride nanofilm having a continuously or discontinuously decreased thickness in the layering direction, in which the thickness of the unit is maintained constant, and IX') a nitride nanofilm having a continuously or discontinuously decreased thickness in the layering direction and a boron nitride nanofilm having a continuously or discontinuously increased thickness in the layering direction, in which the thickness of the unit is maintained constant.

Here, as the thicknesses of the nitride nanofilm and the boron nitride nanofilm may be independent of each other 0.2 nm to 5.0 nm, the unit may have a thickness of 0.4 nm to 10.0 nm, and as a specific example, when the thicknesses of the nitride nanofilm and the boron nitride nanofilm are independent of each other 0.2 nm to 1.5 nm, the unit may have a thickness of 0.4 to 3.0 nm. When the boron nitride nanofilm having a sub-nanometer thickness is considered, in a specific example, the unit may have a thickness of 0.8 to 2.4 nm, but the thickness is not necessarily limited thereto.

In addition, in the nanolayered structure including the cases of I) to IX) described above, the thickness of the unit may be changed in the layering direction, so that the nanolayered structure has further improved mechanical and optical physical properties, but it is preferred that the thickness of each unit belonging to the nanolayered structure is in a range of 0.8 to 2.4 nm.

Advantageously, the thickness of the boron nitride nanofilm may be continuously or discontinuously decreased or increased in a layering direction of the nanolayered structure. This is because when the thickness of the boron nitride nanofilm is decreased to a sub-nanometer order, mechanical strength and flexibility may be surprisingly improved, but when the thickness of the boron nitride nanofilm is increased, the visible light transparency of the nanolayered structure may be improved. Thus, among the thicknesses of the nitride nanofilm and the boron nitride nanofilm, the thickness of the boron nitride nanofilm is continuously or discontinuously decreased or increased in the layering direction, thereby improving the strength, the flexibility, and the optical transparency of the nanolayered structure simultaneously.

As an example of a structure in which the thickness of the boron nitride nanofilm is continuously or discontinuously decreased or increased in the layering direction, the nanolayered structure includes a layered area in which the nitride nanofilm and the boron nitride nanofilm are alternately layered, and the layered area may include a first layered area, a second layered area, and a third layered area, in which the thickness of the boron nitride nanofilm is decreased depending on the layering direction for each layered area. In addition, the first layered area, the second layered area, and the third layered area may be sequentially layered in the layering direction. Here, the layered area refers to an area in which the nitride nanofilm and the boron nitride nanofilm having the same thickness, respectively, in the nanolayered structure, are alternately layered, of course, and may have a thickness of 0.1 $T_{total}$ to 0.9 $T_{total}$, as a specific example, 0.1 $T_{total}$ to 0.8 $T_{total}$, based on $T_{total}$, but the thickness is not necessarily limited thereto.

In the first layered area provided with the thickest boron nitride nanofilm, mechanical properties such as a hardness may be somewhat deteriorated, but the visible light transparency of the nanolayered structure may be greatly improved, and in the second layered area provided with the boron nitride nanofilm having a decreased thickness as compared with the first layered area and the third layered area provided with the boron nitride nanofilm having a decreased thickness as compared with the second layered area, visible light transparency is somewhat deteriorated as compared with the first layered area, but the hardness and the flexibility of the nanolayered structure may be greatly improved and a significantly high hardness may be imparted to the surface of the nanolayered structure.

As a specific example, the nitride nanofilm in the first layered area to the third layered area may have the same thickness or different thicknesses for each layered area, but in terms of mechanical property improvement of the nanolayered structure, the nitride nanofilm may have advantageously a non-sub-nanometer thickness and substantially a thickness of 1.0 to 1.5 nm.

As a specific example, in terms of light transparency improvement, the boron nitride nanofilm in the first layered area may have a non-sub-nanometer thickness and substantially a thickness of 1.0 to 1.5 nm. In terms of mechanical property and flexibility improvement, the boron nitride nanofilm in the second layered area and the boron nitride nanofilm in the first layered area may have a sub-nanometer thickness, respectively. Substantially, the boron nitride nanofilm in the second layered area may have a thickness of 0.9 to 0.5 nm, and the boron nitride nanofilm in the third layered area may have a thickness of 0.2 to 0.5 nm, but the boron nitride nanofilm in the third layered area may be thinner than the boron nitride nanofilm in the second layered area.

The nitride of the nitride nanofilm may be a nitride of one or more elements selected from metals and metalloids, and the metal may include transition metals and post-transition metals. As a specific example, the nitride may be titanium nitrides, tungsten nitrides, silicon nitrides, tantalum nitrides, aluminum nitrides, chromium nitrides, composite nitrides thereof, or the like having a high hardness (hard), but is not limited thereto.

The nitride of the nitride nanofilm may be in the state of N-deficiency based on a stoichiometric ratio. The mechanical strength and the flexibility of the nanolayered structure may be greatly improved by the boron nitride nanofilm having a sub-micrometer thickness described above, and independently thereof, the mechanical strength and the flexibility of the nanolayered structure may be greatly improved also by the nitride in the state of N-deficiency.

Specifically, when the nitride nanofilm is in the state of N-deficiency, hardness may be improved by up to 120% of the nanolayered structure having the same structure and the same dimension, which is provided with the nitride satisfying a stoichiometric ratio.

Specifically, in the state of N-deficiency to a certain degree, the mechanical strength and the flexibility which are substantially almost similar to those of the nitride film having a stoichiometric ratio are shown, but when the nitride nanofilm in the state of N-deficiency beyond the certain degree is provided, the nanolayered structure may have much improved mechanical strength and flexibility.

More specifically, when the nitride of the nitride nanofilm is in the state of N-deficiency in which 0.2 to 0.6 standard moles of nitrogen is contained, the standard mole being moles of nitrogen required according to the stoichiometric ratio of the nitride-based on 1 mole of a metal or metalloid constituting the nitride, the nanolayered structure may have much improved mechanical strength and flexibility. Furthermore, the nitride of the nitride nanofilm is in the state of N-deficiency in which 0.35 to 0.6 standard moles of nitrogen is contained; the nanolayered structure may also have an excellent light transmittance (as an example, 80% or more) property. Here, when two or more nitrides having different stoichiometric ratios are spontaneously present, the nitride as a basis for the stoichiometric ratio may be the most thermodynamically stable nitride (a nitride having a lowest Gibbs free energy) under room temperature and normal pressure conditions, of course. In addition, a light in the light transmittance may be visible light, ultraviolet rays (UV), or infrared rays (IR), and the visible light may refer to light at a wavelength band of 400 to 700 nm, the ultraviolet rays may refer to light at a wavelength band of 10 nm to 400 nm, specifically UV-A at a wavelength band of 320 nm to 400 nm, UV-B at a wavelength band of 280 nm to 320 nm, UV-C at a wavelength band of 100 nm to 280 nm, or a combination thereof, and the infrared rays may refer to light at a wavelength band of 0.75 µm to 1 mm, specifically near-infrared rays at a wavelength band of 0.75 µm to 3 µm, infrared rays at a wavelength band of 3 µm to 25 µm, far-infrared rays at a wavelength band of 25 µm to 1 mm, or a combination thereof.

In the nanolayered structure, according to an exemplary embodiment of the present invention, each of the nitride nanofilm and the boron nitride nanofilm may be an amorphous film. That is, in an exemplary embodiment, the nanolayered structure may be a structure in which an amorphous nitride nanofilm and an amorphous boron nitride nanofilm are alternately layered. As known in the art, amorphousness is a structure in which elements have a short-range order, but not a long-range order. Experimentally, an amorphous structure may mean that not a diffraction spot in an electron diffraction pattern but only a halo pattern is observed.

In the nanolayered structure, according to an exemplary embodiment of the present invention, the boron nitride nanofilm may have an sp3 bond which is a bonding state of boron nitride having a cubic structure atomic arrangement close to one of (cubic boron nitride; CBN). The boron nitride having an sp3 bond has high ductility and hardness and a visible light transmittance up to 90%, which is thus advantageous.

In the nanolayered structure, according to an exemplary embodiment of the present invention, the interface between the nitride nanofilm and the boron nitride nanofilm in the laminate may have a structure in which the nitride and the boron nitride are intermixed due to interdiffusion. This is due to the fact that the nitride nanofilm and the boron nitride nanofilm are formed based on sputtering involving physical bombardment (collision) as in production method described later, a material being deposited by sputtering collides and diffuses on the surface of a previously deposited film, and an interface area in which the nitride and the boron nitride are intermixed in the form of interdiffusion may be produced.

Since the interface between the nitride nanofilm and the boron nitride nanofilm has a structure in which the nitride and the boron nitride are intermixed due to interdiffusion, the interface may contain not only a nitride or boron nitride of metals or metalloids but also a boride of metals or metalloids.

The nanolayered structure produced by the sub-nanometer thickness and the intermixed interfacial structure and sputtering deposition based on physical bombardment improves binding force between nanofilms to be layered and binding force between the nanolayered structure and the article to be protected, thereby preventing formation of interfacial separation or cracks in spite of repeated stress application to have improved durability.

In addition, the nanolayered structure has a structure in which the nitride and the boron nitride are intermixed in the interface between the nitride nanofilm and the boron nitride nanofilm, together with the nitride nanofilm in the state of N-deficiency and the boron nitride film having a sub-nanometer thickness, thereby having further improved hardness (H), H/E (H=hardness, E=Young's modulus), elastic recovery rate, and the like.

In the nanolayered structure according to an exemplary embodiment of the present invention, the laminate may have a thickness level of several tens to hundreds of nanometers, and in terms of stably securing the physical properties, such as a hardness corresponding to an inorganic wear-resistant coating layer, and elastic recovery, flexibility, and visible light transparency that are close to those of the organic wear-resistant coating layer, by alternately layering a nitride nanofilm in a sub-nanometer level and a nitride nanofilm as thin as possible, the laminate may have a thickness (total thickness) of 100 to 1000 nm, and as a specific example, 100 to 200 nm, but the thickness is not necessarily limited thereto.

The nanolayered structure according to an exemplary embodiment of the present invention may be a structure which is positioned on the surface portion of an object to be protected, imparts wear resistance to the object to be protected, a structure which prevents the object to be protected from wear and damage by friction.

The object to be protected may be any article, as long as it is an article to be protected from damage by friction. As a specific example, the object to be protected may include devices or articles in which a wear-resistant coating layer is traditionally used, such as automobile parts, semiconductor parts, home appliances, various manufacturing devices, or industrial machines including cutting tools or molds.

Furthermore, as the nanolayered structure according to the present invention has excellent optical properties, a flexibility that is close to that of the conventional organic material-based wear-resistant coating layer, and high mechanical properties that are close to those of the conventional ceramic material-based wear-resistant coating layer, the object to be protected may include optical devices, wearable devices, flexible devices, optoelectronic devices, photovoltaic devices, or micro-electro-mechanical systems (MEMS).

Here, if necessary, an adhesive layer for stronger binding to the nanolayered structure may be positioned on the surface of the object to be protected, and the object to be protected may include not only an article itself but also an article having the adhesive layer formed on the surface. The adhesive layer may be a usually used material in the corresponding object to be protected for improving binding force between the coating layer and the object to be protected when a coating layer of a heterogeneous material is formed on the surface of the object to be protected, considering the specific material of the object to be protected.

As described above, the nanolayered structure has anyone requirement among I) to IX) (including the case of VIII') and IX')), so that the required physical properties are satisfied, considering the physical properties and the like required in the type, the use, the use environment, and the like of the article to be protected, thereby controlling the physical properties (hardness, H/E, elastic recovery rate, light transmittance, and the like) of the wear-resistant structure.

Furthermore, the nitride nanofilm and/or the boron nitride nanofilm is/are doped as a dopant, thereby controlling the electrical properties of the wear-resistant structure also.

Specifically, the nanolayered structure may include one or more dopants of a first dopant which provides a forbidden band between energy band gaps of the nitride with an energy level and a second dopant which provides a forbidden band between energy band gaps of the boron nitride with an energy level, and the electrical resistance of the nanolayered structure may be controlled by the dopant. Any dopant is fine as long as it is a dopant known to be commonly used for electrical property adjustment in the corresponding nitride or boron nitride, and the present invention may not be limited by presence or absence of the dopant or the specific material of the dopant.

Here, of course, the forbidden band between energy band gaps of a nitride or boron nitride may refer to an energy level area between a minimum energy level of the conduction band of the nitride or the boron nitride and a maximum energy level of a valance band, in an energy band diagram illustrated based on vacuum electron energy (0).

The nanolayered structure includes a laminate in which the nitride nanofilm and the boron nitride nanofilm are sequentially alternately layered, and the nitride nanofilm may be positioned at the bottom of the laminate, and the boron nitride nanofilm may be positioned at the top of the laminate.

Here, if necessary, the nanolayered structure may further include a surface layer positioned in the upper portion of the laminate, and the surface layer may be a layer of a material conventionally used for improving or imparting wear resistance, scratch resistance, heat resistance, light transmittance, and the like, or unlike this, may be a film of a material identical to the nitride of the nitride nanofilm forming the laminate.

As a specific example, the surface layer may be a nitride of transition metals of metalloids, an oxide of transition metals or metalloids, a carbide of transition metals or metalloids, a carbonitride of transition metals of metalloids, diamond-like carbon (DLC), diamond, and the like, but is not limited thereto, and the thickness of the surface layer is not greatly limited as long as it does not adversely affect the optical properties or the mechanical properties of the nanolayered structure.

The present invention includes an article including the nanolayered structure described above positioned in at least a portion of a surface to be protected.

The article (object to be protected) may be any article as long as it is an article to be protected from damage by friction. As a specific example, the article may include devices in which a wear-resistant coating layer is traditionally used, such as automobile parts, semiconductor parts, home appliances, various manufacturing devices, or industrial machines, including cutting tools or molds.

Furthermore, as the nanolayered structure described above has all properties of excellent light transparency, flexibility, and high hardness, the article may include optical devices, wearable devices, flexible devices, optoelectronic devices, photovoltaic devices, micro-electro-mechanical systems (MEMS), or the like, but is not limited thereto.

The present invention includes a method of producing the nanolayered structure described above.

In the description of the method of producing the nanolayered structure, the metals and the metalloids, the nitride nanofilm, the boron nitride nanofilm, the laminate, the layered structure of the nanolayered structure, the dimension of the nanolayered structure, and the like are similar to or the same as those described above for the nanolayered structure, and thus, the method of producing the nanolayered structure includes the entire descriptions above for the nanolayered structure.

The present invention includes a method of producing the nanolayered structure described above.

The method of producing a nanolayered structure according to the present invention includes alternately repeating a first process of sputtering a target of one or more elements selected from metals and metalloids on a surface of an object to be protected, under a nitrogen-containing atmosphere to form a nitride nanofilm; and a second process of sputtering a target of boron or boron nitride, under a nitrogen-containing atmosphere to form a boron nitride nanofilm, thereby forming the nanolayered structure.

In the method of producing a nanolayered structure according to an exemplary embodiment of the present invention, one or more factors selected from the group consisting of a ratio of a thickness of the boron nitride nanofilm relative to thicknesses of a pair of films which are the nitride nanofilm and the boron nitride nanofilm being contact with each other by a unit process; a thickness of the nitride nanofilm in the first process; a thickness of the boron nitride nanofilm in the second process; and thicknesses of the nitride nanofilm and the boron nitride nanofilm for each unit process when the unit process is repeated, may be controlled, thereby adjusting one or more physical properties selected from the group consisting of hardness, a ratio of hardness/Young's modulus, and a light transmittance of the nanolayered structure. Here, the light transmittance may be a visible light transmittance, ultraviolet transmittance, or an infrared transmittance.

In the method of producing a nanolayered structure according to an exemplary embodiment of the present invention, a deposition rate of the nitride nanofilm in the first process and a deposition rate of the boron nitride nanofilm in the second process may be 1.00 nm/sec or less independently of each other.

In the method of producing a nanolayered structure according to an exemplary embodiment of the present invention, the first process and the second process may be performed at a temperature of 60° C. or lower.

In the method of producing a nanolayered structure according to an exemplary embodiment of the present invention, in each of the first process and the second process, the sputtering of targets may be performed by direct current (DC) pulse sputtering or RF sputtering independently of each other.

In the method of producing a nanolayered structure according to an exemplary embodiment of the present invention, DC pulse sputtering may be performed at a bias voltage (pulsed DC bias voltage) of 15 to 50 V, specifically 25 to 40 V, at a frequency of 1 to 20 kHz, at a pulse duty of 10 to 90%.

In the method of producing a nanolayered structure according to an exemplary embodiment of the present invention, the first process and the second process are performed under the same nitrogen-containing atmosphere, and a volume ratio of nitrogen gas volume/non-nitrogen gas volume contained in the nitrogen-containing atmosphere maybe 0.1 to 2.0.

Specifically, the method of producing a nanolayered structure according to the present invention includes repeating a unit process to form the nanolayered structure, the unit process being a first process of sputtering a target of one or more elements selected from metals and metalloids on a surface of an object to be protected, under a nitrogen-containing atmosphere to form a nitride nanofilm (nitride nanofilm of one or more elements selected from metals and metalloids); and a second process of sputtering a boron target or a boron nitride target, under a nitrogen-containing atmosphere to form a boron nitride nanofilm.

In the method of producing a nanolayered structure according to the present invention, a target of one or more elements selected from metals and metalloids is sputtered on the surface of an object to be protected, using reactive magnetron sputtering, and a process of sequentially sputtering a boron target or a boron nitride target is repeated, thereby forming the nanolayered structure in which the nitride nanofilm and the boron nitride nanofilm are sequentially alternately deposited.

Though it is not necessarily limited thereto, the first process and the second process may be performed in a single chamber, a boron nitride or boron target and a target of one or more elements selected from metals and metalloids are all provided in the chamber, and a holder in which an object to be deposited (as an example, a substrate, an article to be protected, and the like) is positioned is moved, in which the holder is alternately moved between an area where deposition is performed by the boron nitride or boron target and an area where deposition is performed by the target of one or more elements selected from metals and metalloids, whereby the first process and the second process may be alternately performed.

As described above for the nanolayered structure, one or more factors selected from the group consisting of a ratio of a thickness of the boron nitride nanofilm relative to thicknesses of a pair of films which are the nitride nanofilm and the boron nitride nanofilm being contact with each other by a unit process; a thickness of the nitride nanofilm in the first process; a thickness of the boron nitride nanofilm in the second process; and thicknesses of the nitride nanofilm and the boron nitride nanofilm for each unit process when the unit process is repeated, may be controlled, thereby adjusting one or more physical properties selected from the group consisting of hardness, a ratio of hardness/Young's modulus, and a light transmittance of the nanolayered structure.

A process based on reactive sputtering in which the target of one or more elements selected from metals and metalloids is sputtered under a nitrogen-containing atmosphere and the boron nitride or boron target is sputtered under a nitrogen-containing atmosphere, allows the nitride nanofilm or the boron nitride nanofilm to be very precisely alternately layered to a sub-nanometer level, and simultaneously produces the nanolayered structure having an interface in the form in which the nitride and the boron nitride are intermixed by the reactive sputtering involving physical collide, whereby the nanolayered structure may be substantially formed on the surface of the various objects to be protected by a process at room temperature.

In addition, the process based on the reactive sputtering in which the target of one or more elements selected from metals and metalloids is sputtered under a nitrogen-containing atmosphere and the boron nitride or boron target is sputtered under a nitrogen-containing atmosphere may easily control a degree of N-deficiency of the nitride nanofilm by controlling the nitrogen-containing atmosphere.

Sputtering of the target (the target of one or more elements selected from metals and metalloids or the boron nitride or boron target) may be DC sputtering (including DC pulse sputtering), RF sputtering, or a combination thereof, which allows the formation of a nanofilm having a uniformly controlled thickness even in a large area. As an example, the first process to form the nitride nanofilm-the second process to form the boron nitride nanofilm may be performed by DC sputtering-DC sputtering, DC sputtering-RF sputtering, RF sputtering-DC sputtering, or RF sputtering-RF sputtering.

Here, as a very thin film in a sub-nanometer level is deposited, it is preferred that purity of the target may be 4 nines (99.99%) or more, specifically 4 nines or 5 nines (99.999%) or more, in terms of stably excluding the influence from undesired impurities.

In the first process or the second process, a deposition rate of a film may be adjusted mainly by controlling well-known process factors such as voltage applied to the target, a temperature of the object to be protected (temperature of a substrate to be deposited), and gas pressure during deposition, which is known in the art.

As the first process and the second process are processes of depositing the nitride nanofilm and the boron nitride nanofilm, the deposition rate of a film in each of the first process and the second process may be 1.0 nm/sec or less, and as a specific example, may be in a level of 0.80 nm/sec or less, 0.50 nm/sec or less, or specifically, 0.001 to 0.50 nm/sec, and by controlling a deposition time, the film may be deposited to a desired (designed) thickness. As an embodiment, the deposition rate of the nitride nanofilm in the first process may be 0.010 to 0.050 nm/sec, and the deposition rate of the boron nitride nanofilm in the second process may be 0.001 to 0.010 nm/sec, specifically 0.005 to 0.010 nm/sec, but is not necessarily limited thereto.

The first process and the second process may be performed at a temperature of 60° C. or lower, specifically, 10 to 50° C., respectively, and the object to be deposited (as an example, a substrate, an object to be protected, etc.) may be maintained at a temperature of 60° C. or lower, specifically 10 to 50° C. By maintaining the temperature of the object to be protected on which the films are deposited at a low temperature of 60° C. or lower using a usual cooler, the deposition rate may be decreased, and the object to be deposited on which deposition is performed (as an example, a substrate, an object to be protected, etc.) is free from thermal damage, and only by controlling a deposition time (time during which the first process or the second process is performed), the films having designed thicknesses may be stably, reproducibly, and repeatedly deposited.

In each of the first process and the second process, as a specific condition of the factors to perform deposition at a deposition rate described above, a gas pressure during deposition may be 0.1 to 1.0 Pa, but is not necessarily limited thereto.

An N-deficiency degree of the nitride nanofilm to be produced may be adjusted, by controlling a relative volume ratio of non-nitrogen gas:nitrogen gas under a nitrogen-containing atmosphere. Advantageously, a volume ratio obtained by dividing a volume of nitrogen gas by a volume of non-nitrogen gas may be 0.1 to 2.0, specifically 0.2 to 1.8, 0.5 to 1.8, 1.0 to 1.8, 0.1 to 1.0, 0.2 to 0.5, or 0.1 to 0.4, which allows the production of the nanolayered structure having significantly improved mechanical strength as compared with the nanolayered structure provided with the nitride nanofilm satisfying a stoichiometric ratio. The nitrogen-containing gas may be any nitrogen-containing material, as long as it may be supplied in a gas state and sputtered, and provide nitrogen for a metal (or a metalloid) deposited on the surface of the object to be protected to form a nitride. A specific example of the nitrogen-containing gas may include nitrogen ($N_2$), and a specific example of the non-nitrogen gas may include inert gas (argon, helium, etc.), and the like.

During DC sputtering, a negative DC voltage, specifically, a pulsed DC bias, may be applied to an object to be deposited on which deposition is performed (as an example, a substrate, an object to be protected, etc.). A voltage of the pulsed DC bias may be 15 to 50 V, 25 to 40 V, specifically 30 to 40 V, and more specifically 32 to 38 V. The voltage is advantageous for stably forming a film of a continuum even at an extremely fine thickness of sub-nanometer such as 0.3 nm and also forming an interpenetrated structure at the interface of the films. The pulsed DC bias may be applied at a pulse of 1 to 20 kHz, specifically 5 to 20 kHz, and more specifically 5 to 15 kHz, but the present invention is not limited by the substrate bias conditions, of course. Here, a pulse duty may be 10 to 90%, but is not necessarily limited thereto.

During RF sputtering, the sputtering may be performed at a power of 40 to 80 W but is not necessarily limited thereto.

In addition, in each of the first process and the second process, a distance between the object to be protected and the target may be in a degree of uniform deposition considering a diameter of the target, a size of the object to be protected, and the like, and as an example, may be 10 to 15 cm, but is not limited thereto.

The present invention includes a nanolayered structure produced by the production method described above.

Example 1

A silicon nitride nanofilm and a boron nitride nanofilm were alternately deposited at the thicknesses of Table 1 on a lime glass substrate or a poly(ethylene terephthalate) (PET) substrate using reactive magnetron sputtering, thereby producing a nanolayered structure. Before deposition, the substrate was precleaned by 30 W RF plasma for 15 minutes under an argon atmosphere.

During the reactive magnetron sputtering deposition, an Si (5-nine purity, the diameter of 100 mm) target and a BN (4-nine purity, the diameter of 100 mm) target were used, mixed gas having a volume ratio of $N_2$/Ar of 0.4 was used as an atmospheric gas, a bottom pressure before the deposition was $2.5 \times 10^{-4}$ Pa, and an operating pressure during a deposition process was 0.6 Pa. The operating pressure was measured by Baratron Gauge, and controlled by an automatic throttle valve. During the deposition, a negative DC pulse bias at 35 V was applied between a substrate holder and an anode of a magnetron with a frequency of 10 kHz. A substrate temperature during deposition was monitored by a heat-resistant sensor and did not exceed 55° C. A film deposition rate was 0.11 nm/sec in the case of silicon nitrides and 0.025 nm/sec in the case of boron nitride, and a film thickness was controlled by exposure time (deposition time). Here, the film deposition rate was an average deposition rate calculated by forming a silicon nitride or boron nitride film having a thickness of several nanometers under the same conditions as Example 1.

Here, as summarized in the following Table 1, the nanolayered structure produced in Example 1-7 was a structure in which a first layered area composed of 9 pairs of silicon nitride nanofilms and boron nitride nanofilms formed by alternately layering the silicon nitride nanofilm having a thickness of 1.2 nm and the boron nitride nanofilm having a thickness of 1.1 nm in a substrate side, a second layered area composed of 12 pairs of silicon nitride nanofilms and boron nitride nanofilms formed by alternately layering the silicon nitride nanofilm having a thickness of 1.2 nm and the boron nitride nanofilm having a thickness of 0.7 nm in a substrate side, and a third layered area composed of 40 pairs of silicon nitride nanofilms and boron nitride nanofilms formed by alternately layering the silicon nitride nanofilm having a thickness of 1.2 nm and the boron nitride nanofilm having a thickness of 0.3 nm in a substrate side, are sequentially formed.

TABLE 1

|  |  | Thickness of silicon nitride nanofilm (nm) | Thickness of boron nitride nanofilm (nm) | Number of silicon nitride nanofilm-boron nitride nanofilm pair |
|---|---|---|---|---|
|  | Example 1-1 | 0.6 | 0.3 | 165 |
|  | Example 1-2 | 1.2 | 0.7 | 79 |
|  | Example 1-3 | 1.2 | 1.1 | 65 |
|  | Example 1-4 | 0.6 | 1.1 | 88 |
|  | Example 1-5 | 1.2 | 0.3 | 100 |
|  | Example 1-6 | 0.6 | 0.7 | 115 |
| Example 1-7 | First layered area (substrate side) | 1.2 | 1.1 | 9 |
|  | Second layered area | 1.2 | 0.7 | 12 |
|  | Third layered area (surface side) | 1.2 | 0.3 | 40 |

Example 2

A nanolayered structure was produced in the same manner as in Example 1, except that a mixed gas having a volume ratio of $N_2$/Ar of 0.2, 0.6, 0.8, or 1 was used instead of a mixed gas having a volume ratio of $N_2$/Ar of 0.4 during deposition, and a silicon nitride nanofilm having a thickness of 1.2 nm and a boron nitride nanofilm having a thickness of 0.7 nm were alternately layered 79 times.

Example 3

A nanolayered structure was produced in the same manner as in Example 1, except that a negative DC pulse bias of 10 V, 30 V, or 40 V was used instead of a negative DC pulse bias of 35 V during deposition, and a silicon nitride nanofilm having a thickness of 1.2 nm and a boron nitride nanofilm having a thickness of 0.3 nm were alternately layered 100 times (100 pairs of silicon nitride nanofilms-boron nitride nanofilms).

Comparative Example 1

A process was performed in the same manner as in Example 1, except that only a boron nitride film was deposited at a thickness of 150 nm on a substrate without performing alternate deposition.

Comparative Example 2

A process was performed in the same manner as in Example 1, except that only a silicon nitride film was deposited at a thickness of 150 nm on a substrate without performing alternate deposition.

The thickness of each of the nitride nanofilms and the boron nitride nanofilms may be experimentally measured by transmission electron microscope (TEM) observation, and may be a value having a significant digit in accordance with a spatial resolution of an electron microscope. Specifically, when the spatial resolution of an electron microscope is in a category of $10^{-2}$ nm, thickness may be a value having a significant digit at $10^{-2}$ (two decimal points) based on a nm unit. More specifically, the thickness of each film may be an average thickness calculated by using a high resolution-transmission electron microscope (HR-TEM) image, in which the thicknesses are measured at 10 or more areas different from each other in the image.

A hardness (H) and Young's modulus (E) may be measured by nanoindentation (see Kulikovsky, V. Y., Shaginyan, L., Vereschaka, V. & Hatynenko, N. Preparation of thin hard boron nitride films by r. f. magnetron sputtering. Diam. Relat. Mater. 4, 113-119 (1995). Randall, N. X., Vandamme, M. & Ulm, F. J. Nanoindentation analysis as a two-dimensional tool for mapping the mechanical properties of complex surfaces. J. Mater. Res. 24, 679-690 (2009)). Nanoindentation was performed using a high-precision hardness tester (Anton Paar, UNHT), and a Berkovich indenter having a tip radius of 20 nm was used. The indentation test was repeated 30 times, and an average value calculated therefrom was taken. A device was corrected using fused silica (standard sample) before the nanoindentation test, and indentation hardness was calculated using an Oliver-Pharr method. In order to avoid a substrate effect in hardness measurement, an indentation depth was maintained at around 20% of the thickness of the coating (structure).

Transparency (transmittance) was measured at visible light wavelength range (400-700 nm) using a UV/VIS spectrophotometer (V-650, JASCO). A beam spot size was 100 μm and a scan speed was 1000 nm/min.

A sliding test was performed using a custom-made tribotester. A general load of 50 mN was applied to a silicon nitride ball having a thickness of 1.6 mm. A sliding stroke was 2 mm, and the number of sliding cycles was 1000. The sliding test was repeated three times with a new silicon nitride ball.

A bending test was performed using a custom-built bending tester. A specimen (a PET substrate with a structure formed) was bent at 180° for 1000 cycles at a speed of 0.5 Hz, and a bending radius was 5 mm.

FIG. 1 illustrates a transmission electron microscope image (a) and high resolution-transmission electron microscope (HR-TEM) images (b and c) of the nanolayered structures produced in Examples 1 to 7. In the high resolution-transmission electron microscope photographs, (b) is a image in which a first layered area and a second layered area are observed and the lower left is a substrate, and (c) is a image in which a third layered area is observed. As seen from FIG. 1, it was found that a boron nitride film and a silicon nitride film were alternately layered in the form of a dense film of a stable continuum, a coating in which the boron nitride film and the silicon nitride film were alternately layered at a thickness substantially similar to those in Table 1 was produced, and as the thickness of the film is decreased, the thickness of the film practically produced by intermixing between adjacent films was a little decreased.

Figure 2:
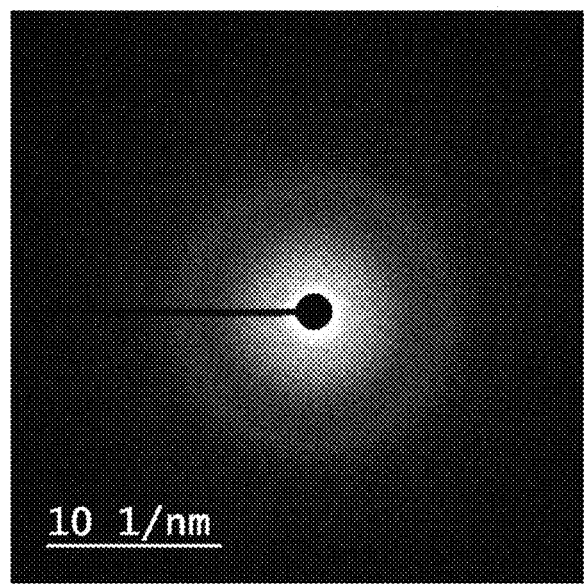
FIG. 2 illustrates a result of X-ray diffraction analysis of the nanolayered structure produced in Example 1.

FIG. 2 illustrates a selected area electron diffraction (SAED) pattern of the nanolayered structures produced in Examples 1 to 7, and as seen from FIG. 2, only a halo pattern was observed. It was confirmed from the electron diffraction analysis at the time of transmission electron microscope observation that an amorphous nanolayered structure, that is, a nanolayered structure of a silicon nitride amorphous film and a boron nitride amorphous film was produced.

Figure 3:
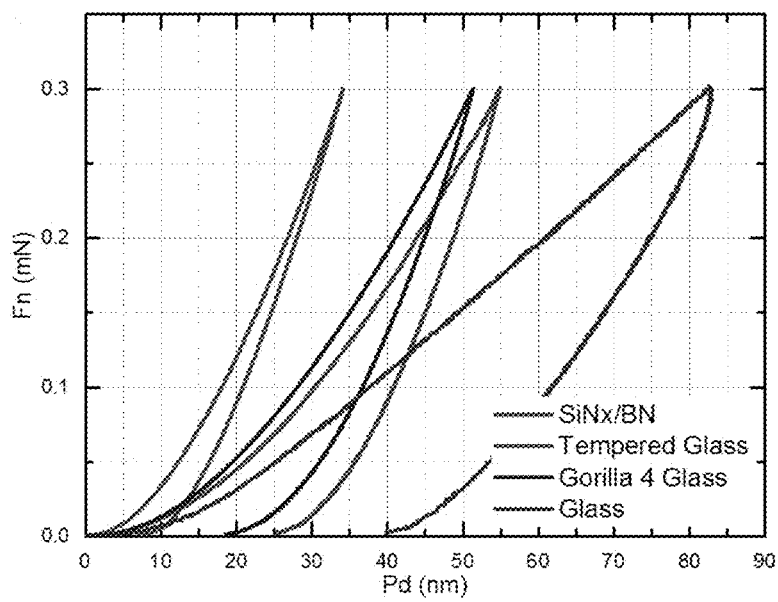
FIG. 3 illustrates a load-displacement curve of each of the nanolayered structure produced in Example 1, a tempered glass, Gorilla Glass 4, and a lime glass.

FIG. 3 illustrates load-displacement curves using an ultra-nano indentation, for each of the nanolayered structures produced in Examples 1 to 7 (SiNx/BN in FIG. 3), tempered glass (Tempered Glass in FIG. 3), Gorilla Glass 4 which is commercially available from Corning (Gorilla 4 glass in FIG. 3), and lime glass used as a substrate in the examples (Glass in FIG. 3).

Figure 4:
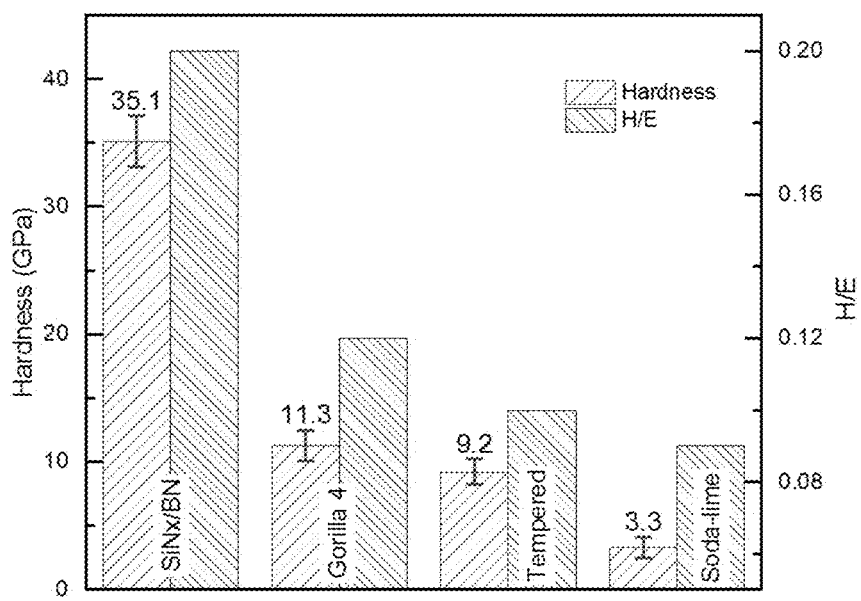
FIG. 4 illustrates a hardness (H) and a ratio of hardness/Young's modulus (H/E) of each of the nanolayered structure produced in Example 1, a tempered glass, Gorilla Glass 4, and a lime glass.

FIG. 4 illustrates a hardness (H) and a ratio of hardness/Young's modulus (H/E) for each of the nanolayered structures (SiNx/BN in FIG. 4), tempered glass (Tempered in FIG. 4), Gorilla Glass 4 which is commercially available from Corning (Gorilla 4 in FIG. 4), and lime glass used as a substrate in the examples (Glass in FIG. 4), using the hardness (H) and Young's modulus (elastic modulus, E) measured by ultra-nanoindentation illustrated in FIG. 3.

As seen from FIGS. 3 and 4, it was found that the produced nanolayered structures had an extremely high hardness up to 35.1 GPa. The hardness of the nanolayered structure is more than three times the hardness of Gorilla 4 Glass, which is a commercial product. It was found that the produced nanolayered structure had an extremely high hardness, and also, by a low Young's modulus, when H/E reached 0.2, the produced nanolayered structure had excellent flexibility. In addition, the elastic recovery rate of the nanolayered structure produced was 80% or more.

The produced nanolayered structure is free from pores and cracks, has elastic recovery rate of 80% or more, a high strength of 35.1 Gpa that is close to that of sapphire, and H/E up to 0.2 which satisfies the requirements of a flexible hard coating. The nanolayered structure may be very effectively utilized as a flexible hard coating.

Figure 5:
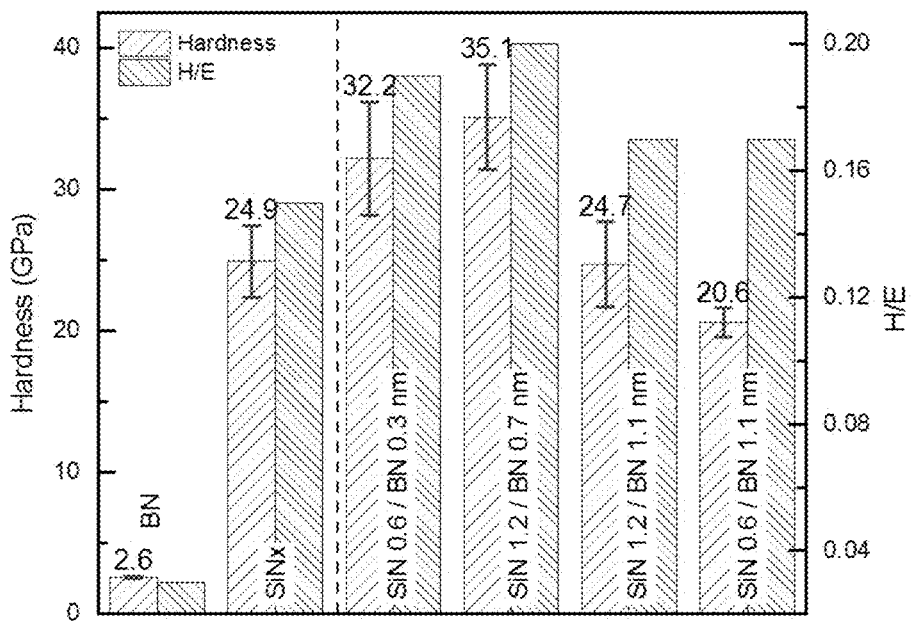
FIG. 5 illustrates a hardness (H) and a ratio of hardness/Young's modulus (H/E) of each of the nanolayered structures produced in Comparative Example 1, Comparative Example 2, and Example 1.

FIG. 5 illustrates a hardness (H) and a ratio of hardness/Young's modulus (H/E) of each of the boron nitride film produced in Comparative Example 1 (BN in FIG. 5), the silicon nitride film produced in Comparative Example 2 (SiNx in FIG. 5), the nanolayered structure produced in Example 1-1 (SiN 0.6/BN 0.3 nm in FIG. 5), the nanolayered structure produced in Example 1-2 (SiN 1.2/BN 0.7 nm in FIG. 5), the nanolayered structure produced in Example 1-3 (SiN 1.2/BN 1.1 nm in FIG. 5), and the nanolayered structure produced in Example 1-4 (SiN 0.6/BN 1.1 nm in FIG. 5).

As seen from FIG. 5, the hardness of each of the boron nitride film and silicon nitride film, which were deposited using the same method and condition, was only 2.6 and 24.9 GPa. However, it was found that when the boron nitride nanofilm and the silicon nitride nanofilm were alternately layered to form the nanolayered structure, the hardness was greatly improved as compared with each of the single material films.

In addition, when nitrides of metals or metalloids which are harder than boron nitride are alternately layered in the form of a nanofilm, the thickness of the nitride of metals or metalloids and the thickness of boron nitride are adjusted, thereby easily controlling the mechanical strength and the flexibility of the produced nanolayered structure.

As seen from FIG. 5, it was found that when the thickness of the nitride of metals or metalloids which is relatively hard is increased under the condition in which the boron nitride nanofilm has a sub-nanometer thickness (when a ratio of the nitride of metals or metalloids in the entire nanolayered structure is increased), the hardness, and the ratio of hardness/Young's modulus (H/E) of the nanolayered structure is improved.

Figure 6:
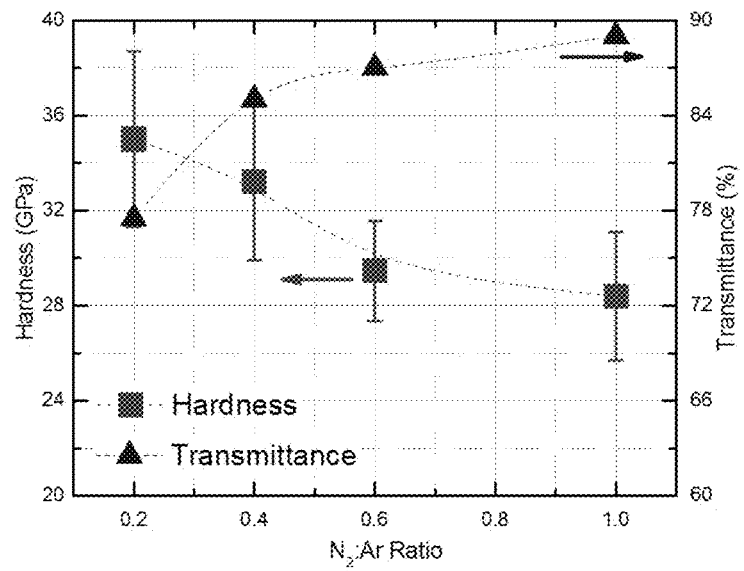
FIG. 6 illustrates a hardness and a visible light transmittance depending on a ratio of $N_2$/Ar of the nanolayered structure produced in Example 2.

FIG. 6 illustrates a hardness and a visible light transmittance depending on a ratio of $N_2/Ar$ of the nanolayered structure produced in Example 2.

As seen from FIG. 6, it was found that the state of N-deficiency of the nitride of metals or metalloids has a great influence on the hardness and the light transmittance, together with the sub-nanometer thickness of boron nitride.

Specifically, it was found that as the state of N-deficiency of the nitride of metals or metalloids in the nitride nanofilm is more severe, the hardness is increased, and the light transmittance is decreased. However, it was found that near a ratio of $N_2/Ar=0.4$, a degree of light transmittance decrease is not high, so that a rapid increase in strength is achieved while having a high light transmittance of 85% or more, thereby producing a nanolayered structure having an excellent hardness up to 35 GPa.

As a result of performing elemental analysis for the silicon nitrides of the nanolayered structure produced in Example 2, it was confirmed that when a ratio of $N_2/Ar=0.4$, an atomic ratio of Si:N is 55:42 (1:0.764), when a ratio of $N_2/Ar=0.2$, an atomic ratio of Si:N is 1:0.320, a rapid hardness increase was shown in a range of 1:0.3 to 0.8 of an atomic ratio of Si:N, and a rapid hardness increase and an excellent light transmittance (visible light transmittance of 80% or more) of the nanolayered structure were shown in a range of 1:0.5 to 0.8 of an atomic ratio of Si:N.

Figure 7:
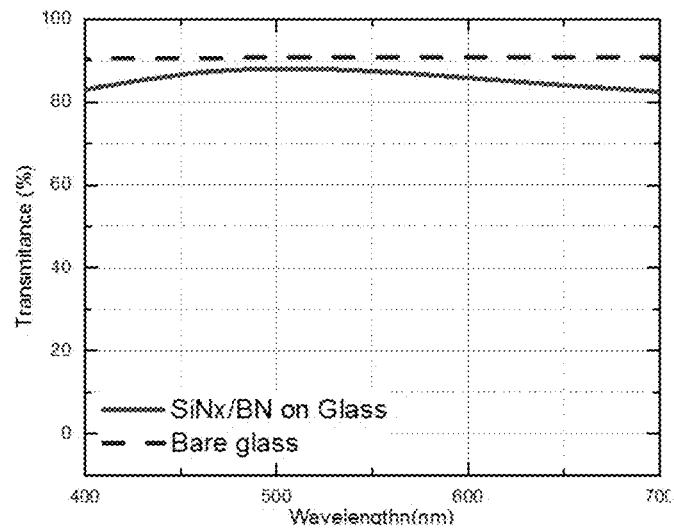
FIG. 7 illustrates a light transmittance in a visible light region of a lime glass and the nanolayered structure produced in Example 1.
Figure 8:
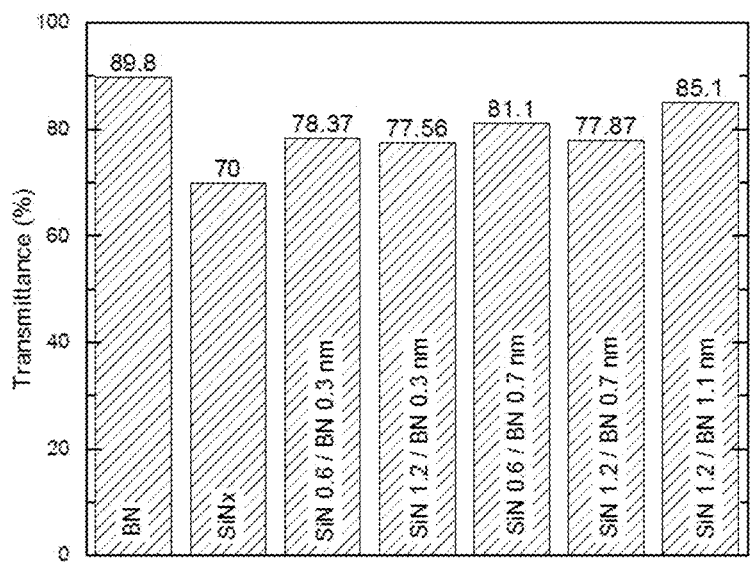
FIG. 8 illustrates a visible light transmittance of each of the nanolayered structures produced in Comparative Example 1, Comparative Example 2, and Example 1.

FIG. 7 illustrates a light transmittance in a visible light region of a glass used as a substrate in the example (Bare glass in FIG. 7) and the nanolayered structure produced in Examples 1 to 7 (SiNx/BN in FIG. 7), and FIG. 8 illustrates a visible light transmittance of each of a boron nitride film produced in Comparative Example 1 (BN in FIG. 8), a silicon nitride film produced in Comparative Example 2 (SiNx in FIG. 8), the nanolayered structure produced in Example 1-1 (SiN 0.6/BN 0.3 nm in FIG. 8), the nanolayered structure produced in Example 1-5 (SiN 0.6/BN 0.3 nm in FIG. 8), the nanolayered structure produced in Example 1-6 (SiN 0.6/BN 0.7 nm in FIG. 8), the nanolayered structure produced in Example 1-2 (SiN 1.2/BN 0.7 nm in FIG. 8), and the nanolayered structure produced in Example 1-3 (SiN 1.2/BN 1.1 nm in FIG. 8).

As seen from FIG. 7, it was found that the produced nanolayered structure represented a light transmittance of 80% or more in the entire visible light region of 400 to 700 nm. In addition, as seen from FIG. 8, as transparent boron nitride and translucent nitrogen-deficient silicon nitrides are layered, all of the produced nanolayered structures had a visible light transmittance of 75% or more. In addition, it was found that by increasing the thickness of transparent boron nitride (by increasing a ratio of boron nitride in the entire nanolayered structure), the produced nanolayered structure had a visible light transmittance of 80% or more.

Figure 9:
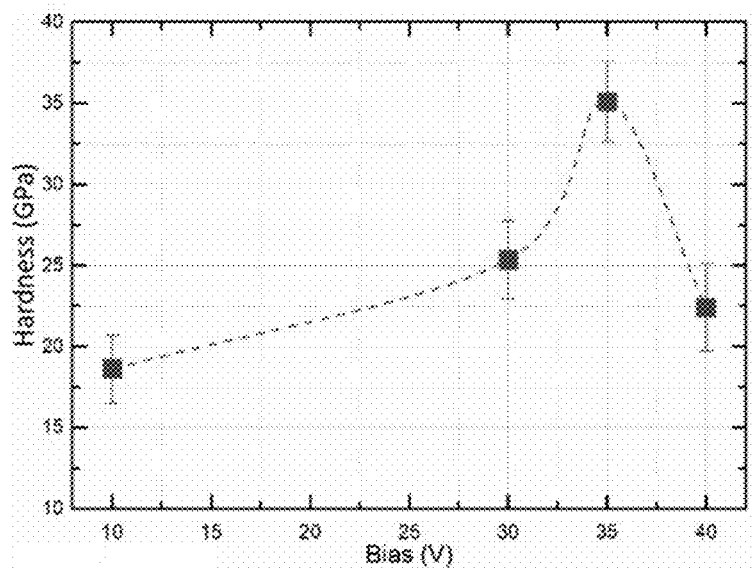
FIG. 9 illustrates the measurement of hardness depending on a DC bias voltage of the nanolayered structure produced in Example 3.

FIG. 9 illustrates a hardness of the nanolayered structure produced in Example 3, in which the hardness of the nanolayered structure depending on a DC pulse bias value during deposition is illustrated. As seen from FIG. 9, it was found that a nanofilm was formed, but in the interface thereof, a large increase in the hardness values occurred at a high bias value, specifically in a level of 25 to 40 V, advantageously in a level of 30 to 40 V, which causes a structure in which nitride and boron nitride are intermixed by physical bombardment occurring during a deposition process.

In order to test the surface protection property of the produced nanolayered structure, a friction test was performed. Specifically, FIG. 10 illustrates optical images in which a wear degree after sliding a hard silicon nitride ball 1000 times on each of a PET substrate and the nanolayered structures produced on a PET substrate in Examples 1 to 7 was observed and surface depth profiles of the surfaces after the sliding.

Figure 10:
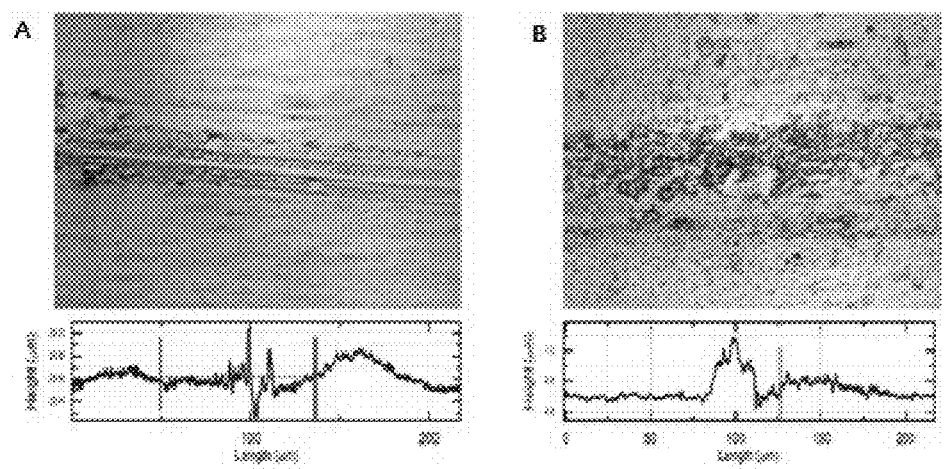
FIG. 10 illustrates the results of a surface protection property test (wear resistance test) of the nanolayered structure produced in Example 1.

As seen from FIG. 10, plastic deformation and deep digging occurred on the PET substrate, but no wear occurred on the PET substrate provided with the nanolayered structure. On the contrary, it was confirmed that protrusions were formed by the material of the ball adhering to the surface, due to the wear of the silicon nitride ball, in the area where the wear test was performed (wear track).

Figure 11:
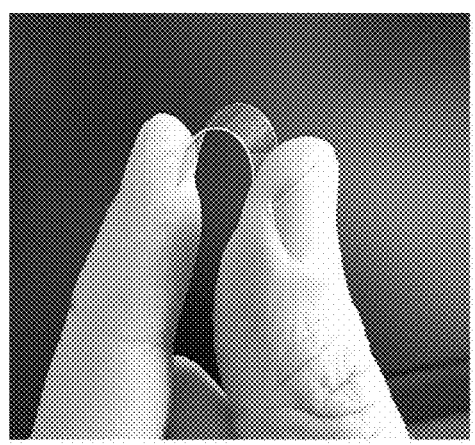
FIG. 11 is an optical image in which it is observed that a nanolayered structure-PET substrate produced in Example 1 is physically bent.

FIG. 11 is an optical image in which the PET substrate on which the nanolayered structures of Examples 1 to 7 were formed was physically bent. As seen from FIG. 11, it may be directly confirmed that the produced nanolayered structures had excellent flexibility.

In addition, in order to test the binding force and the flexibility between the nanolayered structure and the substrate, for the PET substrate on which the nanolayered structures of Examples 1 and 2 were formed, a flexural test was performed by bending the substrate at a rate of 0.5 Hz forward and backward within a bending radius of 5 mm using a bending tester, so that tensile and compression stress were repeatedly applied. After repeated bending 1000 times, physical damage was confirmed using a 3D laser confocal microscope, and it was confirmed that even after applying repeated tensile and compression stress 1000 times, the PET substrate on which the nanolayered structure was formed had no cracks or peeling.

Figure 12:
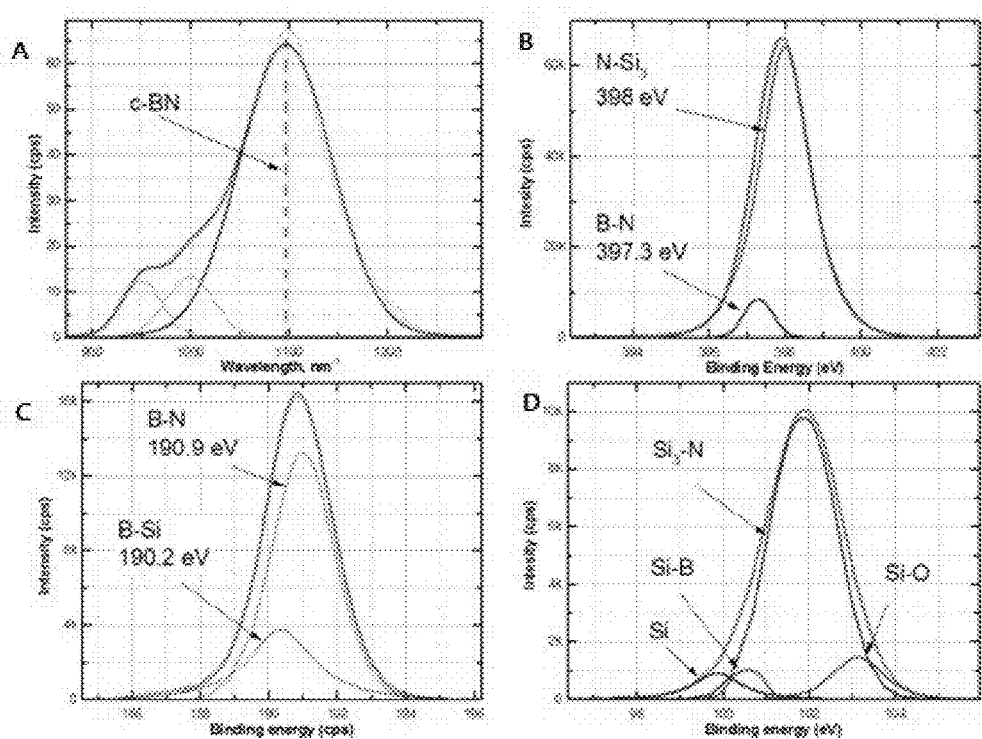
FIG. 12 illustrates a Raman spectroscopic analysis result and an X-ray photoelectron spectroscopic analysis result of the nanolayered structure produced in Example 1.

FIG. 12 illustrates the result of Raman spectroscopy analysis (a) and the result of X-ray photoelectron spectroscopy (XPS) analysis of the nanolayered structure produced in Example 1, in which (b) is an $N_{1s}$ spectrum, (c) is a $B_{1s}$ spectrum, and (d) is a $Si_{2p}$ spectrum.

As seen from FIG. 12, it was found that boron nitride of the boron nitride nanofilm has a atomic arrangement close to one of cubic boron nitride, that is, an sp3 bond, boron nitride and silicon nitrides are intermixed in the interface between the films by physical bombardment occurring during sputtering deposition, and not only N—Si$_3$ and B—N bonds but also a B—Si bond (190.2 eV) is also present. In addition, for the silicon nitrides, Si—B, Si—O, and Si—Si bonds were observed, together with a Si—N bond (101.6 eV). Thus, it was found that the silicon nitrides of the silicon nitride nanofilm contain pure silicon, silicon oxides, and silicon borides, together with SiNx in the state of N-deficiency.

As a result of performing elemental analysis by depositing only the silicon nitride film under the same condition as in Example 1, it was confirmed that the silicon nitrides of the silicon nitride nanofilm contained 55 atomic % of silicon, 42 atomic % of nitrogen, and 3 atomic % of oxygen, and had a measured Si:N atomic ratio of 55:42 and is in the state of large N-deficiency relative to the stoichiometric ratio (43:57) of silicon nitride.

The nanolayered structure according to the present invention has a structure in which a nitride nanofilm having a sub-nanometer thickness and a nitride nanofilm having a sub-nanometer thickness are alternately layered, thereby having a hardness corresponding to an inorganic wear-resistant coating layer based on metal nitride or carbide, elastic recovery and flexibility that are close to those of a conventional organic wear-resistant coating layer based on a polymer or siloxane, and a high visible light transmission of 90% or more.

Hereinabove, although the present invention has been described by specific matters and limited exemplary embodiments and drawings, they have been provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scope and spirit of the invention.

What is claimed is:

1. A flexible hard coating including a nanolayered structure, wherein the nanolayered structure comprises:
   a plurality of amorphous nitride nanofilms of one or more elements selected from metals and metalloids; and
   a plurality of amorphous boron nitride nanofilms,
      wherein the amorphous nitride nanofilms and the amorphous boron nitride nanofilms are alternately layered, and
      wherein at least one of the amorphous nitride nanofilms is nitrogen-deficient relative to a stoichiometric nitride.

2. The flexible hard coating according to claim 1, wherein the nitride nanofilms and the boron nitride nanofilms independently have a thickness from a sub-nanometer order to a nanometer order.

3. The flexible hard coating according to claim 2, wherein at least one nanofilm of the plurality of the boron nitride nanofilms has a sub-nanometer thickness and further wherein,
   the at least one nanofilm is positioned in a surface portion of the nanolayered structure.

4. The flexible hard coating according to claim 1, wherein
   a thickness of the nitride nanofilms,
   a thickness of the boron nitride nanofilms, or
   a thickness of the nitride nanofilms and a thickness of the boron nitride nanofilms are changed in a layering direction of the nanolayered structure.

5. The flexible hard coating according to claim 1, wherein a thickness of the boron nitride nanofilms is continuously or discontinuously decreased or increased in a layering direction of the nanolayered structure.

6. The flexible hard coating according to claim 1, wherein the nanolayered structure comprises
   a first layered area wherein the nitride nanofilms and the boron nitride nanofilms have a constant first thickness;
   a second layered area formed on the first layered area, wherein the nitride nanofilms and the boron nitride nanofilms in the second layered area have a constant second thickness, the second thickness being less than the first thickness; and a third layered area formed on the second layered area, wherein the nitride nanofilms and the boron nitride nanofilms in the third layered area have a constant third thickness, the third thickness being less than the second thickness.

7. The flexible hard coating according to claim 1, wherein a Raman spectroscopic analysis of the boron nitride nanofilms indicates the presence of sp3 bonds.

8. The flexible hard coating according to claim 1, wherein the nitride nanofilms and the boron nitride nanofilms independently of each other have a thickness of 1.5 nm to 0.2 nm.

9. The flexible hard coating according to claim 1, wherein the nitride and the boron nitride are intermixed in an interface between the nitride nanofilms and the boron nitride nanofilms.

10. The flexible hard coating according to claim 1, wherein the nitride of the nitride nanofilms is selected from the group consisting of titanium nitrides, tungsten nitrides, silicon nitrides, tantalum nitrides, aluminum nitrides, chromium nitrides, composite nitrides thereof.

11. The flexible hard coating according to claim 1, wherein the nanolayered structure has a thickness of 100 to 200 nm.

12. The flexible hard coating according to claim 1, wherein the nanolayered structure includes at least one of
a first dopant which provides a forbidden band between energy band gaps of the nitride with an energy level and
a second dopant which provides a forbidden band between energy band gaps of the boron nitride with an energy level.

13. An article comprising the flexible hard coating according to claim 1 positioned in at least a portion of a surface.

14. An article of claim 13, wherein the article includes an optical device, a wearable device, a flexible device, an optoelectronic device, a photovoltaic device, or a microelectromechanical system (MEMS).

15. A flexible nanolayered structure consisting essentially of:
a plurality of amorphous nitride nanofilms of one or more elements selected from the group consisting of metals, metalloids, and mixtures thereof; and
a plurality of amorphous boron nitride nanofilms,
wherein the amorphous nitride nanofilms alternate with the amorphous boron nitride nanofilms in a stack direction, and
wherein at least one of the amorphous nitride nanofilms is nitrogen-deficient relative to a stoichiometric nitride.

* * * * *